(12) United States Patent
Asagi et al.

(10) Patent No.: US 10,756,430 B2
(45) Date of Patent: Aug. 25, 2020

(54) LIQUID CRYSTAL CELL AND SCANNING ANTENNA

(71) Applicant: SHARP KABUSHIKI KAISHA, Sakai, Osaka (JP)

(72) Inventors: Hiroaki Asagi, Sakai (JP); Isamu Miyake, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 50 days.

(21) Appl. No.: 16/255,653

(22) Filed: Jan. 23, 2019

(65) Prior Publication Data

US 2019/0237870 A1    Aug. 1, 2019

(30) Foreign Application Priority Data

Jan. 26, 2018    (JP) .................. 2018-011569

(51) Int. Cl.
| | |
|---|---|
| *H01Q 3/34* | (2006.01) |
| *H01L 27/12* | (2006.01) |
| *C09K 19/56* | (2006.01) |
| *H01Q 1/38* | (2006.01) |
| *H01Q 15/14* | (2006.01) |

(52) U.S. Cl.
CPC .............. *H01Q 3/34* (2013.01); *C09K 19/56* (2013.01); *H01L 27/124* (2013.01); *H01L 27/1255* (2013.01); *H01Q 1/38* (2013.01); *H01Q 15/14* (2013.01)

(58) Field of Classification Search
CPC .. H01Q 3/34; H01Q 3/44; H01Q 3/36; H01Q 15/14; H01Q 1/38; H01Q 21/0012; H01Q 21/20; H01L 27/124; H01L 27/1255; C09K 19/56; C09K 19/00; C09K 19/104
See application file for complete search history.

(56) References Cited

U.S. PATENT DOCUMENTS

| | | | |
|---|---|---|---|
| 2007/0030436 A1 | 2/2007 | Sasabayashi | |
| 2007/0273599 A1 | 11/2007 | Haziza | |

(Continued)

FOREIGN PATENT DOCUMENTS

| | | | |
|---|---|---|---|
| CN | 1908777 A | | 2/2007 |
| JP | 2000022428 A | * | 1/2000 |

(Continued)

*Primary Examiner* — Raymond R Chai
(74) *Attorney, Agent, or Firm* — ScienBiziP, P.C.

(57) ABSTRACT

A liquid crystal cell in which antenna units are arrayed includes a TFT substrate, a slot substrate, an alignment film, and a liquid crystal layer. The TFT substrate includes a first dielectric substrate, TFTs supported by the first dielectric substrate, and patch electrodes electrically connected to the TFTs. The slot substrate includes a second dielectric substrate and a slot electrode including slots supported by the second dielectric substrate. The alignment film is provided on a surface of at least either each of the patch electrodes or the slot electrode. The alignment film includes a metal oxide film at the foremost surface of the alignment film. The liquid crystal layer is sandwiched between the TFT substrate and the slot substrate and contains liquid crystal molecules that are aligned parallel to the TFT substrate and the slot substrate when no voltage is applied between the patch electrode and the slot electrode.

13 Claims, 9 Drawing Sheets

(56) References Cited

U.S. PATENT DOCUMENTS

| | | | |
|---|---|---|---|
| 2008/0036664 A1* | 2/2008 | Haziza | H01Q 9/0442 343/700 MS |
| 2008/0048922 A1 | 2/2008 | Haziza | |
| 2008/0111755 A1 | 5/2008 | Haziza | |
| 2008/0117113 A1 | 5/2008 | Haziza | |
| 2008/0117114 A1 | 5/2008 | Haziza | |
| 2008/0316142 A1 | 12/2008 | Haziza | |
| 2009/0058747 A1 | 3/2009 | Haziza | |
| 2009/0091500 A1 | 4/2009 | Haziza | |
| 2012/0194399 A1 | 8/2012 | Bily et al. | |
| 2014/0177350 A1* | 6/2014 | Chen | G11C 11/419 365/189.05 |
| 2014/0266897 A1* | 9/2014 | Jakoby | H01Q 1/38 342/368 |
| 2014/0266946 A1 | 9/2014 | Bily et al. | |
| 2014/0299881 A1* | 10/2014 | Oda | H01L 27/124 257/59 |
| 2015/0229028 A1 | 8/2015 | Bily et al. | |
| 2015/0236412 A1* | 8/2015 | Bily | H01Q 3/247 342/374 |
| 2015/0236415 A1* | 8/2015 | Bily | H01Q 13/106 342/372 |
| 2016/0359234 A1 | 12/2016 | Bily et al. | |
| 2016/0372834 A1 | 12/2016 | Bily et al. | |
| 2018/0166780 A1 | 6/2018 | Bily et al. | |
| 2019/0265524 A1 | 8/2019 | Asagi et al. | |

FOREIGN PATENT DOCUMENTS

| | | | |
|---|---|---|---|
| JP | 2007110256 A | * | 4/2007 |
| JP | 2007295044 A | * | 11/2007 |
| JP | 2009-538565 A | | 11/2009 |
| JP | 2013-539949 A | | 10/2013 |
| JP | 2016-512408 A | | 4/2016 |
| WO | 2015/126550 A1 | | 8/2015 |
| WO | 2018/012490 A1 | | 1/2018 |

* cited by examiner

LIQUID CRYSTAL CELL AND SCANNING ANTENNA

CROSS REFERENCE TO RELATED APPLICATION

This application claims priority from Japanese Patent Application No. 2018-011569 filed on Jan. 26, 2018. The entire contents of the priority application are incorporated herein by reference.

TECHNICAL FIELD

The technology described herein relates to a liquid crystal cell and a scanning antenna.

BACKGROUND

Antennas that are used in mobile communication, satellite broadcasting, and the like require a beam scanning function that is capable of changing beam direction. Proposed examples of antennas having such a function include scanning antennas based on the high dielectric anisotropy (birefringence) of liquid crystals (including nematic liquid crystals and polymer-dispersed liquid crystals) (see, for example, Japanese Unexamined Patent Application Publication (Translation of PCT Application) No. 2013-539949, Japanese Unexamined Patent Application Publication (Translation of PCT Application.) No. 2016-512408, Japanese Unexamined Patent. Application Publication (Translation of PCT Application) No. 2009-538565, and International Publication No. 2015/126550).

This type of scanning antenna includes a configuration (i.e. a liquid crystal cell for use in a scanning antenna) in which a liquid crystal layer is sandwiched between two substrates provided with electrodes. On a surface of each electrode of the liquid crystal cell, a protective film constituted by a nitride film or the like or an alignment film constituted by a polyimide film or the like is formed.

A scanning antenna including such a liquid crystal cell controls directivity between the presence of the application of a voltage between electrodes and the absence of the application of a voltage. This control involves the use of the capacitance change properties (variability) of liquid crystals.

The scanning antenna has an antenna unit (antenna element) structured such that a first alignment film, liquid crystals, and a second alignment film are stacked in the order named. Assume here that Cpia is the capacitance of the first alignment film, Clc is the capacitance of the liquid crystals, and Cpib is the capacitance of the second alignment film. Then, simply put, the resultant capacitance C can be expressed as "1/C=1/Cpia+1/Clc+1/Cpib".

Ideally, it is desirable that the antenna gain of the scanning antenna be the ON/OFF ratio in capacitance of Clc_on in the presence of the application of a voltage (ON) to Clc_off in the absence of the application of a voltage (OFF). However, since the protective films or the alignment films, which have insulation properties, are provided on the electrodes, a change Con/Coff in resultant capacitance as an antenna unit cannot avoid becoming smaller than the value of Clc_on/Clc_off. This has presented a problem.

It is conceivable that high-dielectric alignment films may be used so that "1/Cpia" and "1/Cpib" approximate zero. However, in order for the liquid crystals to achieve the innate antenna gain, the relative dielectric constant of all of the films must take on values of several tens to several hundreds. This is not realistic.

SUMMARY

The technology described herein was made in view of the above circumstances. An object is to provide a liquid crystal cell for use in a scanning antenna and a scanning antenna that are superior in capacitance variable performance.

A liquid crystal cell in which antenna units are arrayed includes a TFT, a slot substrate, an alignment film, and a liquid crystal layer. The TFT substrate includes a first dielectric substrate, TFTs supported by the first dielectric substrate, and patch electrodes electrically connected to the TFTs. The slot substrate includes a second dielectric substrate and a slot electrode including slots supported by the second dielectric substrate. The alignment film is provided on a surface of at least either each of the patch electrodes or the slot electrode. The alignment film includes a metal oxide film at the foremost surface of the alignment film. The metal oxide film develops an orientation-retaining force to align liquid crystal molecules. The liquid crystal layer is sandwiched between the TFT substrate and the slot substrate. The TFT substrate and the slot substrate are disposed so that the patch electrode and the slot electrode are opposed to each other. The liquid crystal layer contains liquid crystal molecules that are aligned parallel to the TFT substrate and the slot substrate when no voltage is applied between the patch electrode and the slot electrode.

A scanning antenna includes the liquid crystal cell and a reflective conducting plate disposed to be opposed to an outer principal surface of the second dielectric substrate of the liquid crystal cell with a dielectric layer interposed therebetween.

The technology described herein makes it possible to provide a liquid crystal cell for use in a scanning antenna and a scanning antenna that are superior in capacitance variable performance.

DETAILED DESCRIPTION

First Embodiment

Basic Structure of Scanning Antenna

A scanning antenna includes a beam scanning function that is capable of changing beam direction, and has a structure including antenna units based on the anisotropy (birefringence) of the high dielectric constant M (εM) of a liquid crystal material. The scanning antenna controls a voltage that is applied to the liquid crystal layer of each antenna unit, changes the effective dielectric constant M (εM) of the liquid crystal layer of each antenna unit, and thereby forms a two-dimensional pattern of antenna units differing in capacitance from one another. The term "dielectric constant M (εM)" used herein refers in particular to a dielectric constant that falls within a frequency band of microwaves, as the dielectric constant of a liquid crystal material has frequency dispersion.

Electromagnetic waves (e.g. microwaves) that are emitted from the scanning antenna or that are received by the scanning antenna are given phase differences corresponding to the capacitance of each separate antenna unit and, in accordance with a two-dimensional pattern formed by antenna units differing in capacitance from one another, come to have strong directivity in a specific direction (beam scanning). For example, electromagnetic waves that are emitted from the scanning antenna are obtained by integrating, in consideration of phase differences that are given by each separate antenna unit, spherical waves that are obtained as a result of input electromagnetic waves being incident on each separate antenna unit and being scattered by each separate antenna unit.

Figure 1:
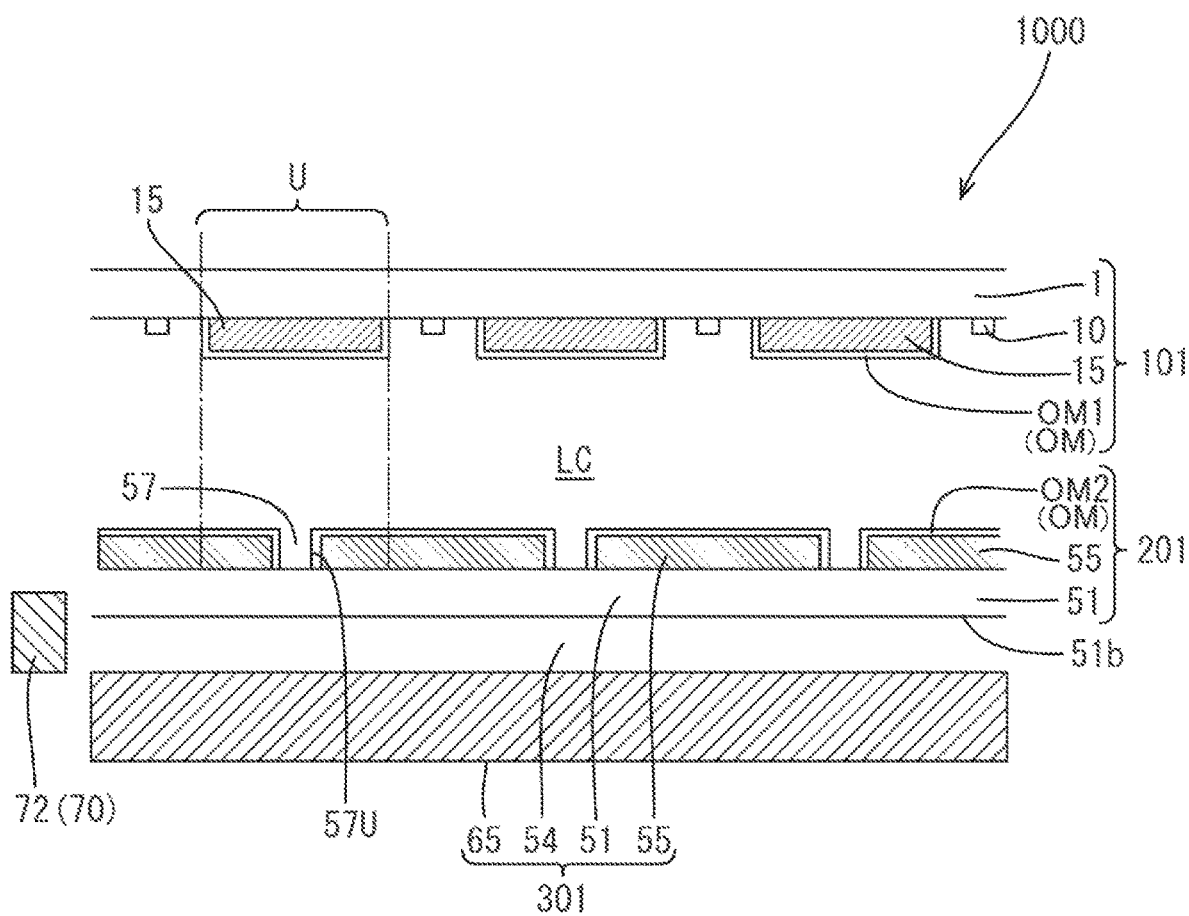
FIG. 1 is a cross-sectional view schematically showing a part of a scanning antenna according to a first embodiment.

A basic structure of a scanning antenna according to an embodiment is described here with reference to FIG. 1 and the like. FIG. 1 is a cross-sectional view schematically showing a part of a scanning antenna 1000 according to a first embodiment. The scanning antenna 1000 according to the first embodiment is a radial in-line slot antenna having slots 57 arrayed in a concentric fashion. FIG. 1 schematically shows a part of a cross-section taken along a radial direction from a feed pin 72 provided near the center of the slots arrayed in a concentric fashion. In another embodiment, the array of the slots may be any of various publicly-known arrays (e.g. a helical array and a matrix array).

The scanning antenna 1000 mainly includes a TFT substrate 101, a slot substrate 201, a liquid crystal layer LC disposed between the TFT substrate 101 and the slot substrate 201, and a reflective conducting plate 65. The scanning antenna 1000 is configured to transmit and receive microwaves through the TFT substrate 101. The TFT substrate 101 and the slot substrate 201 are arranged to be opposed to each other with the liquid crystal layer LC sandwiched therebetween.

The TFT substrate 101 includes a dielectric substrate (which is an example of a first dielectric substrate) 1 such as a glass substrate, TFTs (thin-film transistors) 10 formed on a side of the dielectric substrate 1 that faces the liquid crystal layer LC, patch electrodes 15 formed on the side of the dielectric substrate 1 that faces the liquid crystal layer LC, and an alignment film OM1, formed on each of the patch electrodes 15, that includes a metal oxide film at its foremost surface. A gate bus line and a source bus line (both not illustrated in FIG. 1) are connected to each of the TFTs 10.

The slot substrate 201 includes a dielectric substrate (which is an example of a second dielectric substrate) 51 such as a glass substrate, a slot electrode 55 formed on a side of the dielectric substrate 51 that faces the liquid crystal layer LC, and an alignment film OM2, formed on the slot electrode 55, that includes a metal oxide film at its foremost surface. The slot electrode 55 includes slots 57. The surface of the dielectric substrate 51 that faces the liquid crystal layer PC is referred to as "first principal surface", and the opposite surface is referred to as "second principal surface".

It is preferable that the dielectric substrates 1 and 51, which are used in the TFT substrate and the slot substrate 201, respectively, have small dielectric losses with respect to microwaves. Instead of being glass substrates, the dielectric substrates 1 and 51 may be plastic substrates. Examples of thicknesses of the dielectric substrates 1 and 51 include, but are not particularly limited to, preferably 400 μm or smaller and more preferably 300 μm or smaller. There is no particular lower limit to the thicknesses of the dielectric substrates 1 and 51, provided the dielectric substrates 1 and 51 have the strength to withstand manufacturing processes and the like.

The reflective conducting plate 65 is disposed to be opposed to the slot substrate 201 with an air layer 54 interposed therebetween. That is, the reflective conducting plate 65 is disposed to be opposed to the second principal surface of the dielectric substrate (which is an example of the second dielectric substrate) 51 of the slot substrate 201 with the air layer 54 interposed therebetween. In another embodiment, the air layer 54 may be replaced by a layer formed by a dielectric substance (e.g. fluorine resin such as PTFE) having a small dielectric constant M with respect to microwaves. In the scanning antenna 1000 according to the first embodiment, the slot electrode 55, the reflective conducting plate 65, and the dielectric substrate 51 and air layer 54 interposed therebetween function as a waveguide 301.

Each of the patch electrodes 15, a part of the slot electrode 55 that includes a corresponding one of the slots 57, (such a part being hereinafter sometimes referred to as "slot electrode unit 57U"), and a part of the liquid crystal layer LC sandwiched therebetween constitute an antenna unit U. In each antenna unit U, one island-shaped patch electrode 15 is opposed to one hole-shaped slot 57 (slot electrode unit 57U) with the liquid crystal layer LC sandwiched therebetween, so that a liquid crystal capacitor is formed. In the scanning antenna 1000 according to the first embodiment, antenna units U are arrayed in a concentric fashion. Each of the antenna units U includes an auxiliary capacitor electrically connected in parallel to the liquid crystal capacitor.

The slot electrode 55 not only constitutes an antenna unit V in each slot electrode unit 57U but also functions as a wall of the waveguide 301. Therefore, the slot electrode 55 is constituted by a comparatively thick metal layer, as the slot electrode 55 needs a function of inhibiting the transmission of microwaves. Examples of such a metal layer include a Cu layer, an Al layer, and the like. For example, for reduction of microwaves of 10 GHz to ¹⁄₁₅₀, the thickness of the Cu layer is set to be 3.3 μm or larger and the thickness of the Al layer is set to be 4.0 μm or larger. Further, for reduction of microwaves of 30 GHz to ¹⁄₁₅₀, the thickness of the Cu layer is set to be 1.9 μm or larger and the thickness of the Al layer is set to be 2.3 μm or larger. There is no particular upper limit to the thickness of the metal layer that constitutes the slot electrode 55. Using the Cu layer as the metal layer has an advantage in that the metal layer can be made thinner than when the Al layer is used as the metal layer. The slot electrode 55 may be formed by a thin-film deposition method that is used in a technology of a conventional liquid crystal display device or another method such as pasting metal foil (e.g. Cu foil or Al foil) onto the substrate. The thickness of the slot electrode 55 is set to be for example 1.5 µm or larger and 30 µm or smaller, preferably 1.5 µm or larger and 5 µm or smaller. In a case where the metal layer is formed by the thin-film deposition method, the thickness of the slot electrode 55 is set to be for example 5 µm or smaller. Usable examples of the reflective conducting plate 65 includes an aluminum plate, a copper plate, and the like with a thickness of several millimeters.

Unlike the slot electrode 55, the patch electrodes 15 do not constitute the waveguide 301. As such, the path electrodes 15 may be constituted by a metal layer with a smaller thickness than the slot electrode 55, provided the objectives of the technology described herein are not impaired. For the avoidance of a loss where the oscillation of free electrons near the slots 57 of the slot electrode 55 turns into heat in inducing the oscillation of free electrons within the patch electrodes 15, lower resistance is preferred. For the point of view of mass-producibility and the like, it is more preferable to use the Al layer than to use the Cu layer. Examples of thicknesses of the patch electrodes 15 include preferably 0.5 µm or larger and 10 µm or smaller and more preferably 1.5 µm or larger and 5 µm or smaller.

As described in Japanese Unexamined Patent Application Publication (Translation of PCT Application) No. 2013-539949, the array pitch between antenna units U is set to be for example $\lambda/4$ or smaller or $\lambda/5$ or smaller, assuming that $\lambda$ is the wavelength of a microwave. The wavelength $\lambda$ is for example 25 mm, and in that case, the array pitch is set to be for example 6.25 mm or smaller and/or 5 mm or smaller.

The scanning antenna 1000 changes the capacitance value of the liquid crystal capacitor of each of the antenna units U and thereby changes the phase of a microwave that is excited (reradiated) from each patch electrode 15. Accordingly, it is preferable that the liquid crystal layer LC be high in anisotropy ($\Delta\varepsilon M$) of a dielectric constant M ($\varepsilon M$) with respect to microwaves and be small in tan $\delta M$ (dielectric loss tangent to microwaves).

Although the dielectric constant of a liquid crystal material usually has frequency dispersion, the dielectric anisotropy ($\Delta\varepsilon M$) with respect to microwaves has a positive correlation with the refractive-index anisotropy $\Delta n$ with respect to visible light. Therefore, it can be said that it is preferable that a liquid crystal material for use in in an antenna unit with respect to microwaves be a material having high refractive-index anisotropy $\Delta n$ with respect to visible light. The thickness of the liquid crystal layer LC is set to be for example 1 µm or larger and 500 µm or smaller, preferably 2 µm or larger and 10 µm or smaller, more preferably 2.5 µm or larger and 5.5 µm or smaller. The thickness of the liquid crystal layer LC here is the thickness of a part of the liquid crystal layer LC sandwiched between the slot electrode 55 and each of the patch electrodes 15.

Figure 2:
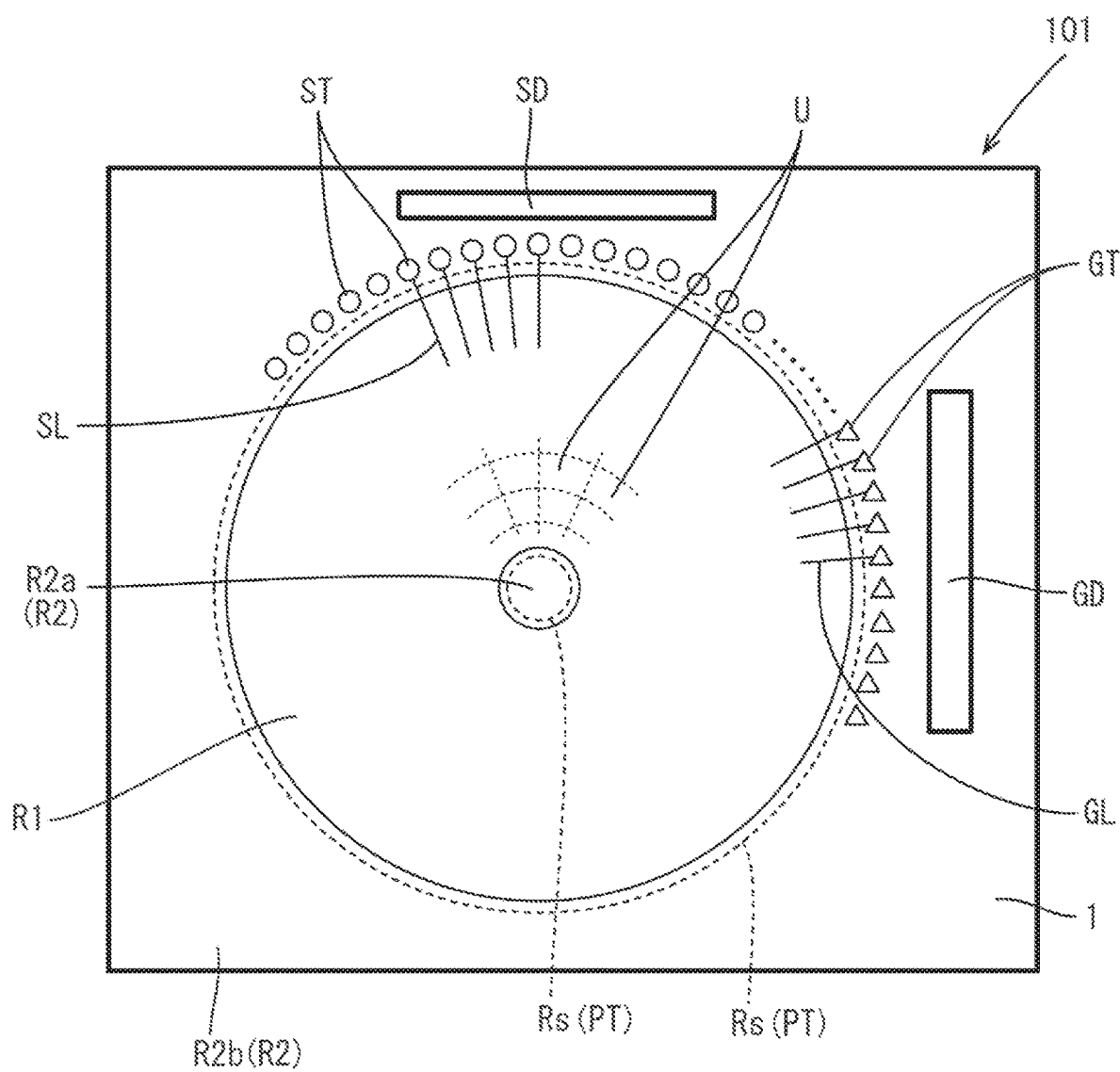
FIG. 2 is a plan view schematically showing a TFT substrate of the scanning antenna.
Figure 3:
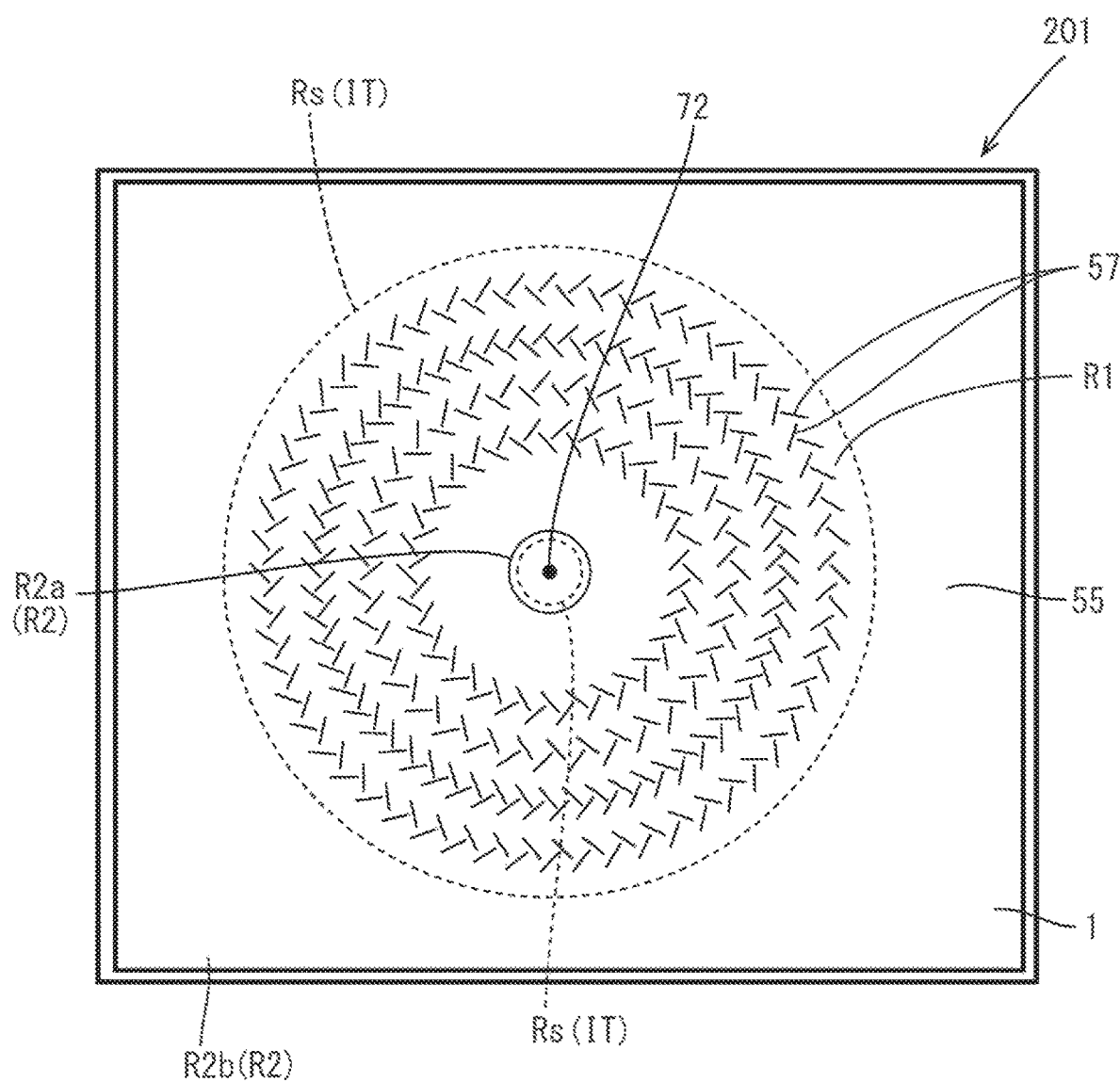
FIG. 3 is a plan view schematically showing a slot substrate of the scanning antenna.

FIG. 2 is a plan view schematically showing the TFT substrate 101 of the scanning antenna 1000, and FIG. 3 is a plan view schematically showing the slot substrate 201 of the scanning antenna 1000. For convenience of explanation, a region in the TFT substrate 101 and a region in the slot substrate 201 that that correspond to an antenna unit U are both referred to as "antenna unit regions", which are referred to by the same sign as the antenna unit U. Further, as shown in FIGS. 2 and 3, regions in the TFT substrate 101 and the slot substrate 201 that are defined by a two-dimensional array of antenna unit regions U are referred to as "transmitting and receiving regions R1", and regions other than the transmitting and receiving regions R1 are referred to as "non-transmitting and non-receiving regions R2". In the non-transmitting and non-receiving regions R2, terminal areas, drive circuits, and the like are disposed.

Each of the transmitting and receiving regions R1 has an annular shape when seen in a plan view. Each of the non-transmitting and non-receiving regions R2 includes a first non-transmitting and non-receiving region R2a located in a central part of a corresponding one of the transmitting and receiving regions R1 and a second non-transmitting and non-receiving region R2b located around the corresponding transmitting and receiving region R1. The outer diameter of each of the transmitting and receiving regions R1 is for example 200 mm or larger and 1500 mm or smaller, and is set as appropriate according to communications traffic or the like.

The transmitting and receiving region R1 of the TFT substrate 101 is provided with gate bus lines GL and source bus lines SL, both supported by the dielectric substrate 1, that are used to control the drive of each of the antenna unit regions U. Each of the antenna unit regions U includes a TFT 10 and a patch electrode 15 electrically connected to the TFT 10. The TFT 10 has its source electrode electrically connected to a source bus line SL and its gate electrode electrically connected to a gate bus line GL. Further, the TFT 10 has its drain electrode electrically connected to the patch electrode 15.

Each of the non-transmitting and non-receiving regions R2 (first non-transmitting and non-receiving region R2a, second non-transmitting and non-receiving region R2b) is provided with sealing regions Rs where sealing materials (not illustrated) are formed to surround the corresponding transmitting and receiving region R1. The sealing materials have a function of bonding the TFT substrate 101 and the slot substrate 201 to each other, a function of sealing in a liquid crystal material (liquid crystal layer LC) between these substrates 101 and 201, and the like.

Outside a sealing region Rs of the non-transmitting and non-receiving region R2 of the TFT substrate 101, gate terminal areas GT, a gate driver GD, source terminal areas ST, and a source driver SD are disposed. Each of the gate bus lines GL is connected to the gate driver GD via a corresponding one of the gate terminal areas GT, and each of the source bus lines SL is connected to the source driver SD via a corresponding one of the source terminal areas ST. Although, in the first embodiment, both the source driver SD and the gate driver GD are formed on the dielectric substrate 1 of the TFT substrate 101, either or both of these drivers may be formed on the dielectric substrate 51 of the slot substrate 201.

Further, the non-transmitting and non-receiving region R2 of the TFT substrate 101 is provided with transfer terminal areas PT. The transfer terminal areas PT are electrically connected to the slot electrode 55 of the slot substrate 201. In the first embodiment, the transfer terminal areas PT are disposed in both the first non-transmitting and non-receiving region R2a and the second non-transmitting and non-receiving region R2b. Another embodiment may be configured such that the transfer terminal areas PT are disposed in either of the regions. Further, in the case of the first embodiment, the transfer terminal areas PT are disposed within the sealing regions Rs. Therefore, the sealing materials are made of conductive resin containing conducting particles (conducting beads).

In the slot substrate 201, as shown in FIG. 3, the slot substrate 55 is formed across the transmitting and receiving region R1 and the non-transmitting and non-receiving region 2 on the dielectric substrate 51. It should be noted that FIG. 3 shows a surface of the slot substrate 201 as seen from the liquid crystal layer LC and, for convenience of explanation, omits to illustrate the alignment film OM2 formed at the foremost surface.

In the transmitting and receiving region R1 of the slot substrate 201, the slot substrate 55 is provided with the slots 57. These slots 57 are assigned one by one to the antenna unit regions U of the TFT substrate 101. In the case of the first embodiment, the slots 57 include pairs of slots 57 extending in directions substantially orthogonal to each other so as to constitute a radial in-line slot antenna. By having such pairs of slots 57, the scanning antenna 1000 can transmit and receive circularly-polarized waves.

In the non-transmitting and non-receiving region R2 of the slot substrate 201, the slot electrode 55 is provided with terminals areas IT. The terminal areas IT are electrically connected to the transfer terminal areas PT of the TFT substrate 101. In the case of the first embodiment, the terminal areas IT are disposed within the sealing regions Rs and, as mentioned above, are electrically connected to the corresponding transfer terminal areas PT through the sealing materials made of conductive resin containing conducting particles (conducting beads).

Further, the first non-transmitting and non-receiving region R2a of the slot substrate 201 is provided with the feed pin 72 placed in the center of the concentric circles formed by the slots 57. Through this feed pin 72, the waveguide 301, which is constituted by the slot electrode 55, the reflective conductive plate 65, and the dielectric substrate 51, is supplied with microwaves. The feed pin 72 is connected to a feed device 70. A feeding method may be a direct feeding method or an electromagnetic coupling method, and a publicly-known feed structure may be employed.

The following describes the TFT substrate 101, the slot substrate 201, and the waveguide 301 in detail.

(Structure of TFT Substrate 101)

Figure 4:
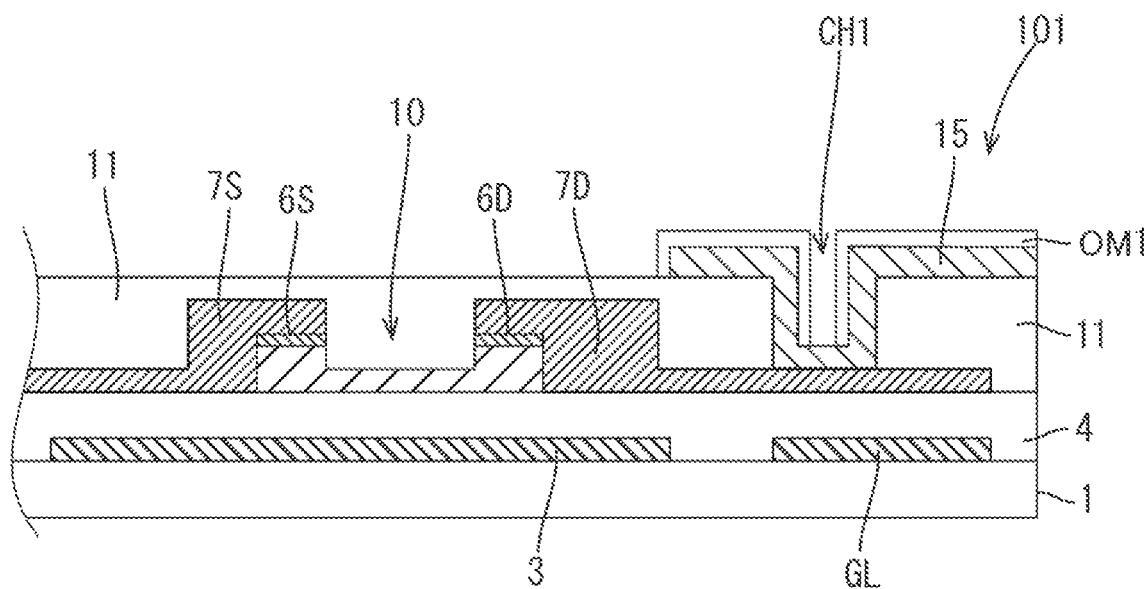
FIG. 4 is a cross-sectional view schematically showing an antenna unit region of the TFT substrate.
Figure 5:
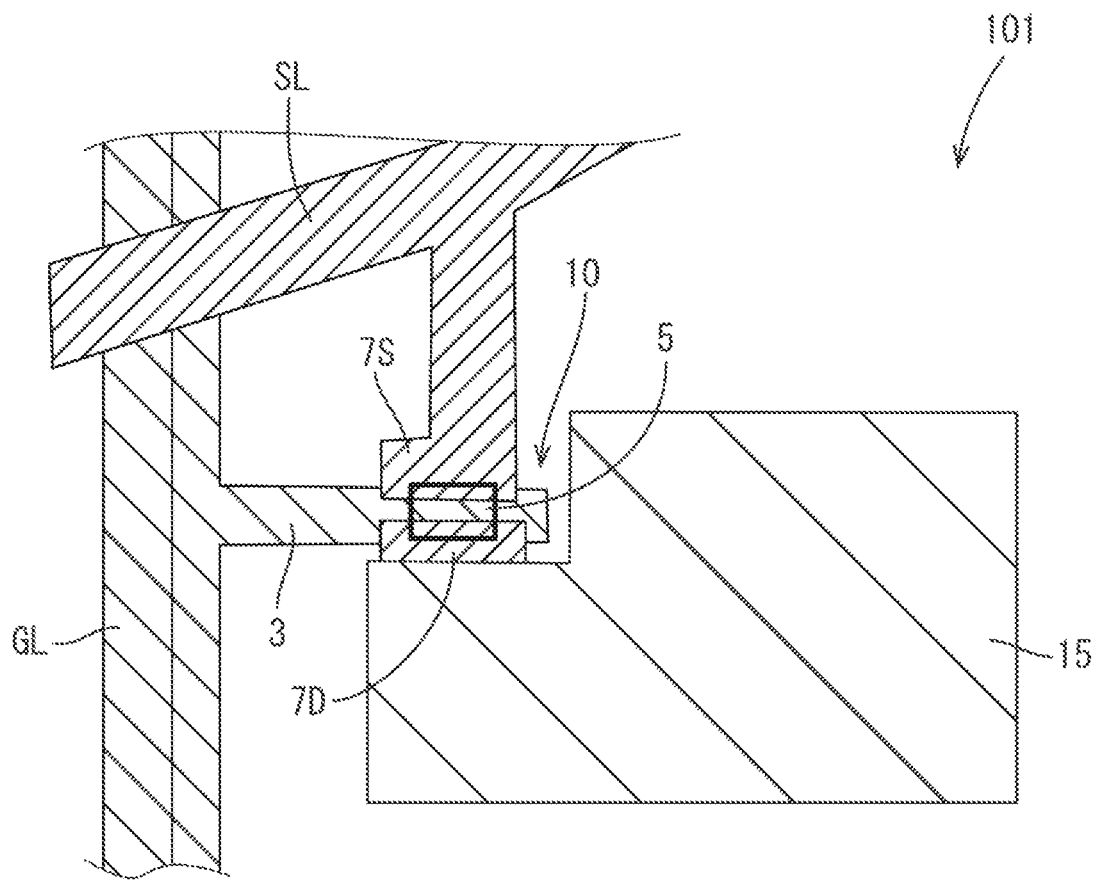
FIG. 5 is a plan view schematically showing an antenna unit region of the TFT substrate.

FIG. 4 is a cross-sectional view schematically showing an antenna unit region U of the TFT substrate 101, and FIG. 5 is a plan view schematically showing an antenna unit region V of the TFT substrate 101. FIGS. 4 and 5 each show a cross-sectional configuration of a part of the transmitting and receiving region R1.

Each of the antenna unit regions U of the TFT substrate 101 includes a dielectric substrate (first dielectric substrate) 1, a TFT 10 supported by the dielectric substrate 1, a first insulating layer 11 covering the TFT 10, a patch electrode 15 formed on the first insulating layer 11 and electrically connected to the TFT 10, and an alignment film OM1 stacked on the patch electrode 15.

The TFT 10 includes a gate electrode 3, an island-shaped semiconductor layer 5, a gate insulating layer 4 disposed between the gate electrode 3 and the semiconductor layer 5, a source electrode 7S, and a drain electrode 7D. In the first embodiment, the TFT 10 is a channel etched type having a bottom gate structure. In another embodiment, the TFT 10 may have another structure.

The gate electrode 3 is electrically connected to a gate bus line GL, and is supplied with a scanning signal from the gate bus line GL. The source electrode 7$ is electrically connected to a source bus line SL, and is supplied with a data signal from the source bus line SL. The gate electrode 3 and the gate bus line GL may be formed by an identical conducting film (gate conducting film). Further, the source electrode 7S, the drain electrode 7D, and the source bus line SL may be formed by an identical conducting film (source conducting film). The gate conducting film and the source conducting film are constituted, for example, by metal films. A layer formed with the gate conducting film is referred to as "gate metal layer", and a layer formed with the source conducting film is referred to as "source metal layer".

The semiconductor layer 5 is disposed to overlap the gate electrode 3 with the gate insulating layer 4 interposed therebetween. As shown in FIG. 4, a source contact layer 6S and a drain contact layer 6D are formed on the semiconductor layer 5. The source contact layer 6S and the drain contact layer 6D are disposed to face both sides of a region (channel region) in the semiconductor layer 5 where a channel is formed, respectively. In the case of the first embodiment, the semiconductor layer 5 is constituted by an intrinsic amorphous silicon (i-a-Si) layer, and the source contact layer 6S and the drain contact layer 6D are constituted by an n$^+$-type amorphous silicon (n$^+$-a-Si) layer. In another embodiment, the semiconductor layer 5 may be constituted by a polysilicon layer, an oxide semiconductor layer, or the like.

The source electrode 7S is provided in contact with the source contact layer 6S, and is electrically connected to the semiconductor layer 5 via the source contact layer 6S. The drain electrode 7D is provided in contact with the drain contact layer 6D, and is electrically connected to the semiconductor layer 5 via the drain contact layer 6D.

The first insulating layer 11 includes a contact hole CH1 that reaches the drain electrode 7D of the TFT 10.

The patch electrode 15 is provided on the first insulating layer 11 and inside the contact hole CH1, and is in contact with the drain electrode 7D inside the contact hole CH1. The patch electrode 15 is constituted mainly by a metal layer. It is preferable that the patch electrode 15 be a metal electrode formed solely by a metal layer. The patch electrode 15 may be made of the same material as the source electrode 7 and the drain electrode 7D. The thickness of the metal layer of the patch electrode 15 (or, in a case where the patch electrode 15 is a metal electrode, the thickness of the patch electrode 15) may be equal to, but is preferably larger than, the thicknesses of the source electrode 7S and the drain electrode 7D. When the thickness of the patch electrode 15 is large, the transmittance of an electromagnetic wave is kept down and the sheet resistance of the patch electrode 15 decreases, so that a loss where the oscillation of free electrons within the patch electrode 15 turns into heat decreases.

Further, a CS bus line CL may be provided using the same conducting film as the gate bus line GL. The CS bus line CL is disposed to overlap the drain electrode 7D (or an extension of the drain electrode 7D) with the gate insulating layer 4 interposed therebetween, and may constitute an auxiliary capacitor CS using the gate insulating layer 4 as a dielectric layer.

In the first embodiment, the patch electrode 15 is formed within a layer that is different from the source metal layer. This gives a configuration in which the thickness of the source metal layer and the thickness of the patch electrode 15 can be controlled independently of each other.

The patch electrode 15 may include a Cu layer or an Al layer as a main layer. The performance of the scanning antenna 1000 correlates with the electric resistance of the patch electrode 15, and the thickness of the main layer is set so that the desired resistance is attained. It is preferable that the patch electrode 15 be low in resistance to such an extent as not to inhibit the oscillation of electrons. For example, the thickness of the patch electrode 15 is preferably 0.5 µm or larger and 10 µm or smaller, more preferably 1.5 µm or larger and 5 µm or smaller. From the point of view of improvement in antenna characteristic and the like, it is preferable that the thickness of the patch electrode 15 be 1.5 or larger.

The alignment film OM1 is made of a metallic material containing a metal oxide film at its foremost surface. The alignment film OM1 will be described in detail later.

The TFT substrate 101 is fabricated, for example, by a method described below. First, the dielectric substrate 1 is prepared. Usable examples of the dielectric substrate 1 include a glass substrate, a heat-resistance plastic substrate, and the like. A gate metal layer including the gate electrode 3 and the gate bus line GL is formed on such a dielectric substrate 1.

The gate electrode 3 may be formed integrally with the gate bus line GL. In this process, a gate conducting film (thickness: for example, 50 nm or larger and 500 nm or smaller) is formed on the dielectric substrate 1 by a sputtering method or the like. Next, the gate electrode 3 and the gate bus line GL are formed by pattering the gate conducting film. Appropriately usable examples of a material of the gate conducting film include, but are not particularly limited to, films each containing a metal such as aluminum (Al), tungsten (W), molybdenum (Mo), tantalum (Ta), chromium (Cr), titanium (Ti), or copper (Cu), an alloy thereof, or a metal nitride thereof. In this process, the gate conducting film thus formed is a laminated film in which MoN (thickness: for example, 50 nm), Al (thickness: for example, 200 nm), and MoN (thickness: for example, 50 nm) are stacked in the order named.

Next, the gate insulating layer 4 is formed so as to cover the gate metal layer. The gate insulating layer 4 is formed by a CVD method or the like. Appropriately usable examples of the gate insulating layer 4 include a silicon oxide ($SiO_2$) layer, a silicon nitride (SiNx) layer, a silicon oxinitride (SiOxNy; x>y) layer, a silicon nitroxide (SiNxOy; x>y) layer, and the like. The gate insulating layer 4 may have a laminated structure. In this process, the gate insulating layer 4 thus formed is a SiNx layer (thickness: for example, 410 nm).

Next, the semiconductor layer 5 and a contact layer are formed on the gate insulating layer 4. In this process, the island-shaped semiconductor layer 5 and the contact layer are obtained by forming an intrinsic amorphous silicon film (thickness: for example, 125 nm) and an $n^+$-type amorphous silicon film (thickness: for example, 65 nm) in the order named and patterning them. The semiconductor layer 5 may be formed by a semiconductor film other than an amorphous silicon film. For example, an oxide semiconductor layer may be formed as the semiconductor layer 5. In this case, there is no need to provide the contact layer between the semiconductor layer 5 and the source and drain electrodes.

Next, a source metal layer including the source electrode 7S, the drain electrode 7D, and the source bus line SL is formed by forming a source conducting film (thickness: for example, 50 nm or larger and 500 nm or smaller) on the gate insulating layer 4 and the contact layer and patterning the source conducting film. At this point in time, the contact layer too is etched, whereby the source contact layer 6S and the drain contact layer 6D, which are separated from each other, are formed.

Appropriately usable examples of a material of the source conducting film include, but are not particularly limited to, films each containing a metal such as aluminum (Al), tungsten (W), molybdenum (Mo), tantalum (Ta), chromium (Cr), titanium (Ti), or copper (Cu), an alloy thereof, or a metal nitride thereof. In this process, the source conducting film thus formed is a laminated film in which MoN (thickness: for example, 30 nm), Al (thickness: for example, 200 nm), and MoN (thickness: for example, 50 nm) are stacked in the order named.

In this process, for example, the source conducting film is formed by a sputtering method, and the patterning (source-drain separation) of the source conducting film is performed by wet etching. After that, a gap is formed by removing, for example by means of dry etching, a part of the contact layer located on a region that serves as the channel region of the semiconductor layer 5, whereby the contact layer is separated into the source contact layer 6S and the drain contact layer 6D. At this point in time, an area near a surface of the semiconductor layer 5 too is etched in the gap (over etching).

Next, the first insulating layer 11 is formed so as to cover the TFT 10. In this example, the first insulating layer 11 is disposed in contact with the channel region of the semiconductor layer 5. Further, the contact hole CH1, which reaches the drain electrode 7D, is formed in the first insulating layer 11 by a publicly-known photolithography technique.

The first insulating layer 11 may for example be an inorganic insulating layer such as a silicon oxide ($SiO_2$) layer, a silicon nitride (SiNx) layer, a silicon oxinitride (SiOxNy; x>y) layer, or a silicon nitroxide (SiMxOy; x>y) layer. In this process, a SiNx layer with a thickness of for example 330 nm is formed as the first insulating layer 11, for example, by a CVD method.

Next, a patch conducting film is formed on the first insulating layer 11 and inside the contact hole CH1 and patterned, whereby the patch electrode 15 is formed in the transmitting and receiving region R1. In the non-transmitting and non-receiving region R2, a patch connector composed of the same conducing film (patch conducting film) as the patch electrode 15 is formed. The patch electrode 15 makes contact with the drain electrode 7D inside the contact hole CH1.

As a material of the patch conducting film, a material which is similar to that of the gate conducting film or the source conducting film may be used. Note, however, that it is preferable that the patch conducting film be set to be thicker than the gate conducting film and the source conducting film.

In this process, the patch conducting film thus formed is a laminated film (MoN/Al/MoN) in which MoN (thickness: for example, 50 nm), Al (thickness: for example, 1000 nm), and MoN (thickness: for example, 50 nm) are stacked in the order named.

Next, the alignment film OM1 is formed on the patch electrode 15. A step of forming the alignment film OM1 will be described in detail later.

After that, the inorganic insulating films (i.e. the first insulating layer 11 and the gate insulating layer 4) are collectively etched, for example, by dry etching using fluorine gas. During the etching, the patch electrode 15, the source bus line SL, and the gate bus line GL function as an etch stop. This causes a second contact hole reaching the gate bus line GL to be formed in the first insulating layer 11 and the gate insulating layer 4 and causes a third contact hole reaching the source bus line SL to be formed in the first insulating layer 11.

Next, a conducting film (thickness: 50 nm or larger and 200 nm or smaller) is formed inside the second and third contact holes, for example, by a sputtering method. A usable example of the conducting film is a transparent conducting film, such as an ITO (indium tin oxide) film, an IZO film, or a ZnO film (zinc oxide film) In this process, the conducing used is an ITO film with a thickness of for example 100 nm.

Next, a gate-terminal upper connector, a source-terminal upper connector, and the like are formed by patterning the transparent conducting film. The gate-terminal upper connector, the source-terminal upper connector, and the like are used for protecting electrodes or wires exposed at the respective terminal areas. In this way, the gate terminal areas GT, the source terminal areas ST, and the like are obtained. In this way, the TFT substrate 101 can be fabricated.

Structure of Slot Substrate 201

Figure 6:
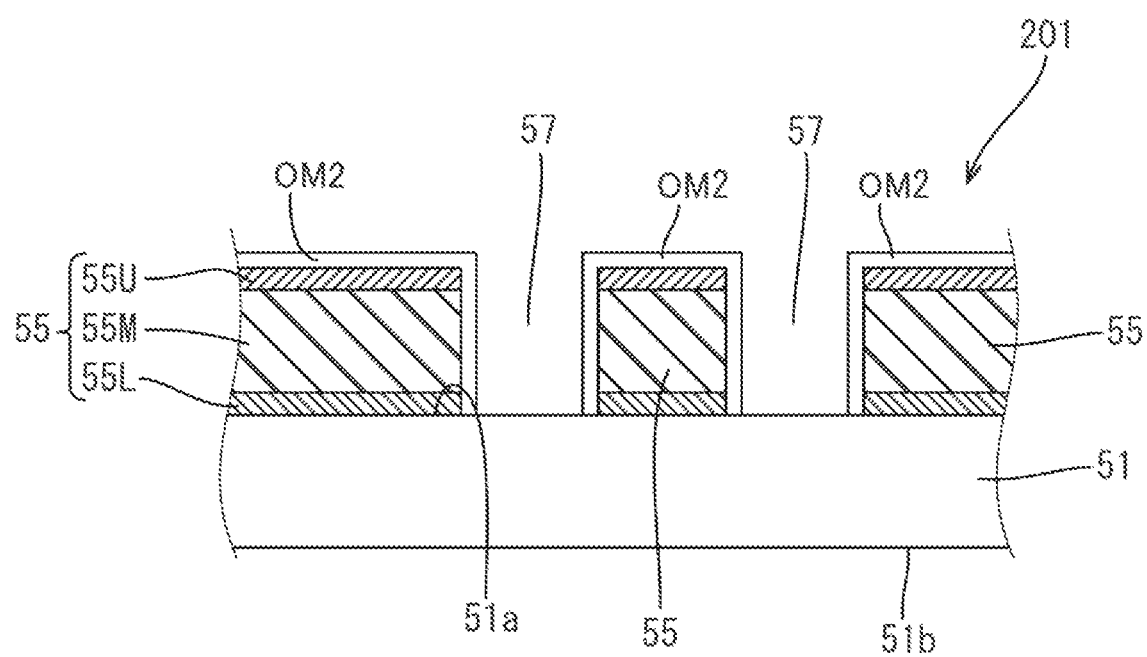
FIG. 6 is a cross-sectional view schematically showing an antenna unit region of the slot substrate.

Next, a structure of the slot substrate 201 is more specifically described. FIG. 6 is a cross-sectional view schematically showing an antenna unit region U of the slot substrate 201.

The slot substrate 201 mainly includes a dielectric substrate (second dielectric substrate) 51, a slot electrode 55 formed on a first plate surface (plate surface that faces the liquid crystal layer LC, plate surface that faces the TFT substrate 101) 51a of the dielectric substrate 51, and a conductive alignment OM2 made of a metallic material and stacked on the slot electrode 55.

In the transmitting and receiving region R1 of the slot substrate 201, the slots 57 are formed in the slot electrode 55 (see FIG. 2). The slots 57 are openings (grooves) bored through the slot electrode 55. In this example, each antenna unit region U is assigned one slot 57.

The slot electrode 55 includes a main layer 55M such as a Cu layer or an Al layer. The slot electrode 55 may have a laminated structure including the main layer 55M and upper and lower layers 55U and 55L disposed to sandwich the main layer 55M. The thickness of the main layer 55M is set in consideration of a skin effect according to material, and may for example be 2 μm or larger and 30 μm or smaller. Typically, the thickness of the main layer 55M is set to be larger than the thickness of each of the upper 55U and lower layers 55L.

In this example, the main layer 55M is constituted by a Cu layer, and the upper and lower layers 55U and 55L are each constituted by a Ti layer. Disposing the lower layer 55l between the main layer 55M, the dielectric substrate 51 makes it possible to improve adhesion between the slot electrode 55 and the dielectric substrate 51. Further, providing the upper layer 55U makes it possible to inhibit corrosion of the main layer 55M (e.g. the Cu layer).

As with the alignment film OM1 of the TFT substrate 101, the alignment film OM2 is made of a metallic material containing a metal oxide film at its foremost surface. The alignment film OM2 will be described in detail later.

In the non-transmitting and non-receiving region R2 of the slot substrate 201, the terminal areas IT are provided (see FIG. 3). Each of the terminal areas IT includes a part of the slot electrode 55 and an upper connector. The upper connector is in contact with a part of the slot electrode 55. In the first embodiment, each of the terminal areas IT is composed of a conducting layer such as an ITO film or an IZO film, disposed in a sealing region Rs, and connected to a transfer terminal area PT of the TFT substrate 101 by sealing resin containing conducting particles (e.g. conducting beads such as Au beads).

The slot substrate 201 is fabricated by a method described below. First, the dielectric substrate 51 is prepared. A usable example of the dielectric substrate 51 is a substrate, such as a glass substrate or a resin substrate, that is high in transmittance (small in dielectric constant ε and dielectric loss tan δ) with respect to microwaves. For reduction of attenuation of microwaves, it is preferable that the dielectric substrate 51 be thin in thickness. For example, after constituent elements of the slot substrate 55 and the like have been formed on a front surface of a glass substrate by the after-mentioned process, the glass substrate may be made thinner from a back surface side. This makes it possible to set the thickness of the glass substrate to be for example 500 μm or smaller. In general, resin is smaller in dielectric constant εM and dielectric loss tan δ than glass. In a case where the dielectric substrate 51 is constituted by a resin substrate, its thickness is for example 3 μm or larger and 300 μm or smaller. As a material of the resin substrate, polyimide or the like is used.

The slot electrode 55 having the slots 57 is obtained by forming a metal film on the dielectric substrate 51 and patterning the metal film. A usable example of the metal film is a Cu film (or an Au film) with a thickness of 1.5 μm or larger and 5 μm or smaller. In this process, a laminated film in which a Ti film, a Cu film, and a Ti film are stacked in the order named is used.

After that, in the non-transmitting and non-receiving region R2, an upper connector, composed of a transparent conducting film, that is in contact with a part of the slot electrode 55 is formed, whereby a terminal area IT to be connected to a transfer terminal area PT of the TFT substrate 101 is obtained.

Then, the alignment film OM2 is formed on the slot electrode 55. A step of forming the alignment film OM2 will be described in detail later. In this way, the slot substrate 201 can be fabricated.

Configuration of Waveguide 301

The waveguide 301 is configured such that the reflective conducting plate 65 is opposed to the slot electrode 55 with the dielectric substrate 51 interposed therebetween. The reflective conducting plate 65 is disposed to be opposed to a back surface of the dielectric substrate 51 with the air layer 54 interposed therebetween. Since the reflective conducting plate 65 constitutes a wall of the waveguide 301, it is preferable that the reflective conducting plate 65 be three or more times, preferably five or more times, as thick as a skin depth. The reflective conducting plate 65 is fabricated, for example, by machining, and a usable example of the reflective conducting plate 65 is an aluminum plate, a copper plate, or the like with a thickness of several millimeters.

For example, when the scanning antenna 1000 sends out signals, the waveguide 301 guides microwaves outward so that the microwaves radially spread. The microwaves are supplied from the feed pin 72 disposed in the center of the antenna units U arrayed in a concentric fashion. The microwaves are cut off by the slots 57 of the antenna units U in moving through the waveguide 301, whereby an electric field is generated due to the so-called slot antenna principle and the action of the electric field induces charge in the slot electrode 55 (that is, the microwaves are converted into the oscillation of free electrons within the slot electrode 55). In each antenna unit U, the phase of the oscillation of free electrons induced by the patch electrode 15 is controlled by changing the capacitance value of the liquid crystal capacitor through control of the orientation of liquid crystals. The induction of charge in the patch electrode 15 causes an electric field to be generated (that is, causes the oscillation of free electrons within the slot electrode 55 to shifts to the oscillation of free electrons within the patch electrode 15), whereby microwaves (radio waves) are generated from the patch electrodes 15 of each separate antenna unit U toward the outside of the TFT substrate 101. The azimuthal angle of a beam is controlled by combining microwaves (radio waves), generated from each separate antenna unit U, that differ in phase from one another.

In another embodiment, a waveguide may be a two-layer structure divided into an upper layer and a lower layer. In this case, microwaves that are supplied from the feed pin 72 move within the lower layer so as to radially spread from the center toward the outside and, after that, rise to the upper layer at an outer wall of the lower layer and move through the upper layer so as to concentrate at the center from the outside. Such a two-layer structure makes it easy to distribute microwaves uniformly to every antenna unit U.

Liquid Crystal Layer LC

It is preferable that the liquid crystal layer LC be constituted by a liquid crystal material (liquid crystal molecules, liquid crystal compound) that has high polarity, as the liquid crystal layer LC needs to have high dielectric constant anisotropy ($\Delta\varepsilon$) in a microwave region (GHz band). A preferred example of the liquid crystal material is one which has at a molecular end at least one functional group selected from the group consisting of a halogen group (F group, Cl group, Br group), an SCN group, an NCS group, a CN group, an OCN group, an NCO group, a $CF_3$ group, an $OCF_3$ group, and an $SF_3$ group. Further, it is preferable that the liquid crystal material have in a molecular chain at least one bond selected from the group consisting of a carbon-carbon triple bond (acetylene bond) —CH≡CH—, —CF≡CF—, —CF═CH—, —CH═CF—, —(CO)O—, —O(CO)—, —CO—, and —O—. It is preferable to include such a bond, as including such a bond increases the polarity of liquid crystal molecules.

Since such a liquid crystal material has high dielectric constant anisotropy, it greatly varies in capacitance with variation in orientation of liquid crystals in the presence of the application of a voltage. Accordingly, using such a liquid crystal material makes it possible to achieve a more high-directivity, high-gain scanning antenna.

Alignment Films OM (OM1 and OM2)

The alignment films OM1 and OM2 (hereinafter sometimes collectively referred to as "alignment films OM") are formed on a surface of each of the patch electrodes 15 and a surface of the slot electrode 55, respectively, and has a structure including, at its foremost surface, a metal oxide film that expresses an orientation-restraining force that aligns liquid crystal molecules. Although, in the first embodiment, the alignment films OM1 and OM2 are formed on the surface of each of the patch electrodes 15 and the surface of the slot electrode 55, respectively, this is not intended to limit the technology described herein. An alignment film OM needs only be formed on the surface of either each of the patch electrodes 15 or the slot electrode 55.

Figure 7:
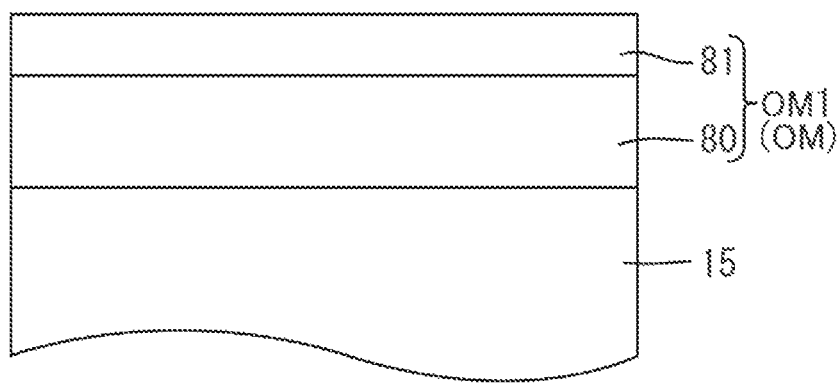
FIG. 7 is an enlarged cross-sectional view schematically showing an alignment film formed on a patch electrode.

The alignment films OM are described here by taking, as an example, an alignment film OM1 formed on a patch electrode 15. FIG. 7 is an enlarged cross-sectional view schematically showing an alignment film OM1 formed on a patch electrode 15. The alignment film OM1 has a two-layer structure, and includes a metal film 80 formed on a surface of the patch electrode 15 and a metal oxide film 81 formed on a surface of the metal film 80.

The metal film 80 is formed on the surface of the patch electrode 15 by using a publicly-known metal film forming method such as an evaporation method. The metal film 80 is disposed on the side of the patch electrode 15, and occupies a large part of the alignment film OM. Therefore, in the first embodiment, the alignment film OM has conductivity. It is preferable that the metal film 80 be made of a metal that increases in surface energy and becomes hydrophilically augmented when irradiated with ultraviolet rays in the after-mentioned hydrophilization process step. Examples of such a metal include Ti, Zn, Ni, Al, Cu, W, Ru, Ag, Cr, and the like. The metal film 80 may be made of an alloy of any of these metals, provided the objectives of the technology described herein are not impaired. Therefore, it is preferable that the metal film 30 be constituted by a film of one type of metal or alloy selected from the group consisting of Ti, Zn, Ni, Al, Cu, W, Ru, Ag, Cr, and alloys thereof.

Preferred examples of the thickness of the metal film 80 include, but hare not particularly limited to, 10 nm or larger, provided the objectives of the technology described herein are not impaired. When the thickness of a metal film 80 that is formed is too thin, the metal film 80 is not formed with a uniform thickness. This leads to a reduction in conductivity of the metal film 80. Furthermore, this causes the metal oxide film 81 to be formed with a non-uniform thickness on the surface of the metal film 80, and may impair the orientation-restraining force that aligns liquid crystals. There is no particular upper limit to the thicknesses of the metal film 80, provided the objectives of the technology described herein are not impaired. However, it is preferable that the upper limit to the thicknesses of the metal film 80 be for example 200 nm or smaller, as an unnecessary increase in film thickness causes an increase in cost and an increase in process time.

The metal oxide film 81 is mainly a part that expresses an orientation-retaining force that aligns liquid crystal molecules, is formed on the surface of the metal film 80, and is much smaller in thickness than the metal film 80. Such a metal oxide film 81 is made of an oxide of one type of metal or alloy selected from the group consisting of Ti, Zn, Ni, Al, Cu, W, Ru, Ag, Cr, and alloys thereof. In the first embodiment, the metal oxide film 81 is constituted by a part, subjected to oxidization and the after-mentioned hydrophilization process, of a surface of a metal film formed on the surface of the patch electrode 15 by an evaporation method or the like. That is, in the first embodiment, the metal oxide film 81 is made of an oxide of a metal constituting the metal film 80.

Although the metal oxide constituting the metal oxide film 81 is usually an insulator (dielectric substance) and can have capacitance, the thickness of the metal oxide film 81 is much smaller than the thicknesses of the metal film 80 and the patch electrode 15. Therefore, it can be said that the capacitance of the metal oxide film 81 at the foremost surface of the alignment film OM1 is substantially of negligible magnitude.

Of the metal oxides any of which constitutes the metal oxide film 81, ruthenium dioxide, which is an oxide of Ru (ruthenium), has conductivity. Therefore, in a case where the metal film 80 is made of ruthenium and the metal oxide film 81, which is formed on the surface of the metal film 80, is made of ruthenium dioxide, the alignment film OM can exhibit the technical effects of the technology described herein, as not only the metal film 80 but also the metal oxide film 81 at the foremost surface serve as conductors.

Preferred examples of the thickness of the metal oxide film 81 include, but are not particularly limited to, 0.1 nm (1 Å) or larger and 10 nm or smaller, provided the objectives of the technology described herein are not impaired. If the thickness of the metal oxide film 81 is too small, the metal film 80 located therebelow may exert an effect so that the orientation-retaining force of the metal oxide film 81 is impaired and the reliability of the metal oxide film 81 in direct contact with the liquid crystal layer LC decreases. On the other hand, if the thickness of the metal oxide film 81 is too large, the metal oxide film 81 will have capacitance of non-negligible magnitude.

A method for forming the alignment film OM1 is described here. First, a metal film is formed on the surface of the patch electrode 15 by using a metal film forming method such as an evaporation method. Then, the metal that constitutes a surface of the metal film is either oxidized by spontaneously reacting with oxygen in the atmosphere or actively oxidized by a heating process or the like, whereby a metal oxide film is formed. For example, in a case where the metal film is made of Ti, Ti at the surface of the metal film becomes a titanium oxide film by instantaneously reacting with atmospheric oxygen. Therefore, in such a case, it is not essential to perform a process (e.g. a heating process) that actively oxidizes the metal film formed on the patch electrode 15. It is preferable to perform a heating process, as performing a heating process makes it possible to obtain a thick, stable metal oxide film. A large part of the metal film that remains unoxidized serves as a metal film 80 that constitutes the alignment film OM1.

Next, when the metal oxide film is irradiated with predetermined light, such as black light, that contains ultraviolet rays, the surface of the metal oxide film is subjected to a hydrophilization process to form a metal oxide film 81 that constitutes the alignment film OM1 and has an orientation-retaining force. As noted above, when the metal oxide film is hydrophilized, the metal oxide film increases in surface energy and improves in wettability at its interface. Dropping liquid crystals onto the metal oxide film 81 thus hydrophilized causes the liquid crystals (liquid crystal molecules) to be aligned parallel to the metal oxide film 81 (so-called horizontal orientation). For expression of an orientation-retaining force that horizontally aligns the liquid crystals, it is preferable that the metal oxide film 81 of the alignment film OM1 have a surface energy of 40 mJ/m$^2$ or higher.

Conditions (such as intensity, wavelength, irradiation time) for light that is used in the hydrophilization process need only be set as appropriate for different purposes. The alignment film OM2 too can be formed on the slot electrode 55 by a method which is similar to that by which the alignment film OM1 is formed.

Incidentally, although, in the first embodiment, the alignment film OM has a two-layer structure including a metal film 80 and a metal oxide film 81 formed on a surface of the metal film 80, this is not intended to limit the structure of an alignment film of the technology described herein. For example, in another embodiment, an alignment film OMa may be formed directly on a surface of an electrode (such as a patch electrode 15a).

Figure 8:
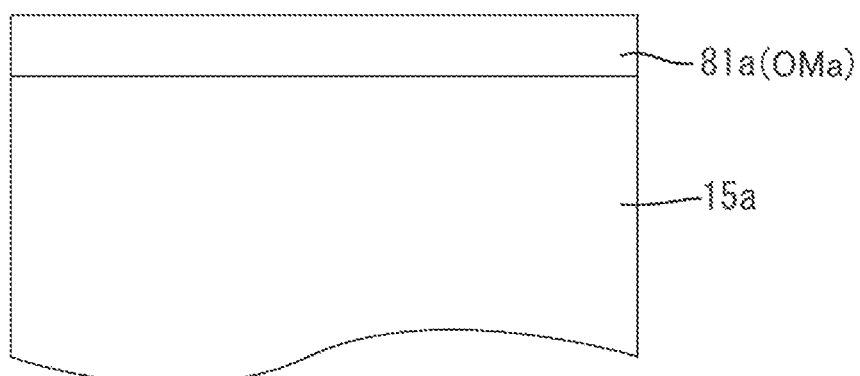
FIG. 8 is an enlarged cross-sectional view schematically showing an alignment film formed on a patch electrode according to another embodiment.

FIG. 8 is an enlarged cross-sectional view schematically showing an alignment film OMa formed on a patch electrode 15a according to another embodiment. A description is given here by taking, as an example, an alignment film OMa formed on a patch electrode 15a. The alignment film OMa shown in FIG. 8 is constituted by an oxide of a part of the metal that constitutes the patch electrode 15a. A usable example of the metal that constitutes the patch electrode 15a is a metal that increases in surface energy and becomes hydrophilically augmented when irradiated with ultraviolet rays in a hydrophilization process step. A usable example of such a metal is one type of metal selected from the group consisting of Ti, Zn, Ni, Al, Cu, W, Ru, Ag, and Cr. The alignment film OMa is constituted solely by a metal oxide film 81a that has an orientation-retaining force, and is in a state of having been formed directly at the foremost surface of the patch electrode 15a. Such an alignment film OMa is obtained by forming a metal film (e.g. an aluminum film) that constitutes the patch electrode 15a, oxidizing a surface of the metal film by a heating process or the like to form a film of a metal oxide (aluminum oxide), and then subjecting the film to a hydrophilization process (ultraviolet irradiation). By thus forming an alignment film OMa (metal oxide film 81a) by using a metal that constitutes an electrode (such as the patch electrode 15a), the process of forming a metal film can be simplified. In order to form the alignment film OMa, it is preferable that the thickness of the electrode (such as the patch electrode 15a) to be oxidized be set in advance to be large. It is preferable that the metal oxide film 81a too have a surface energy of 40 mJ/m$^2$ or higher.

Antenna Unit U

Figure 9:
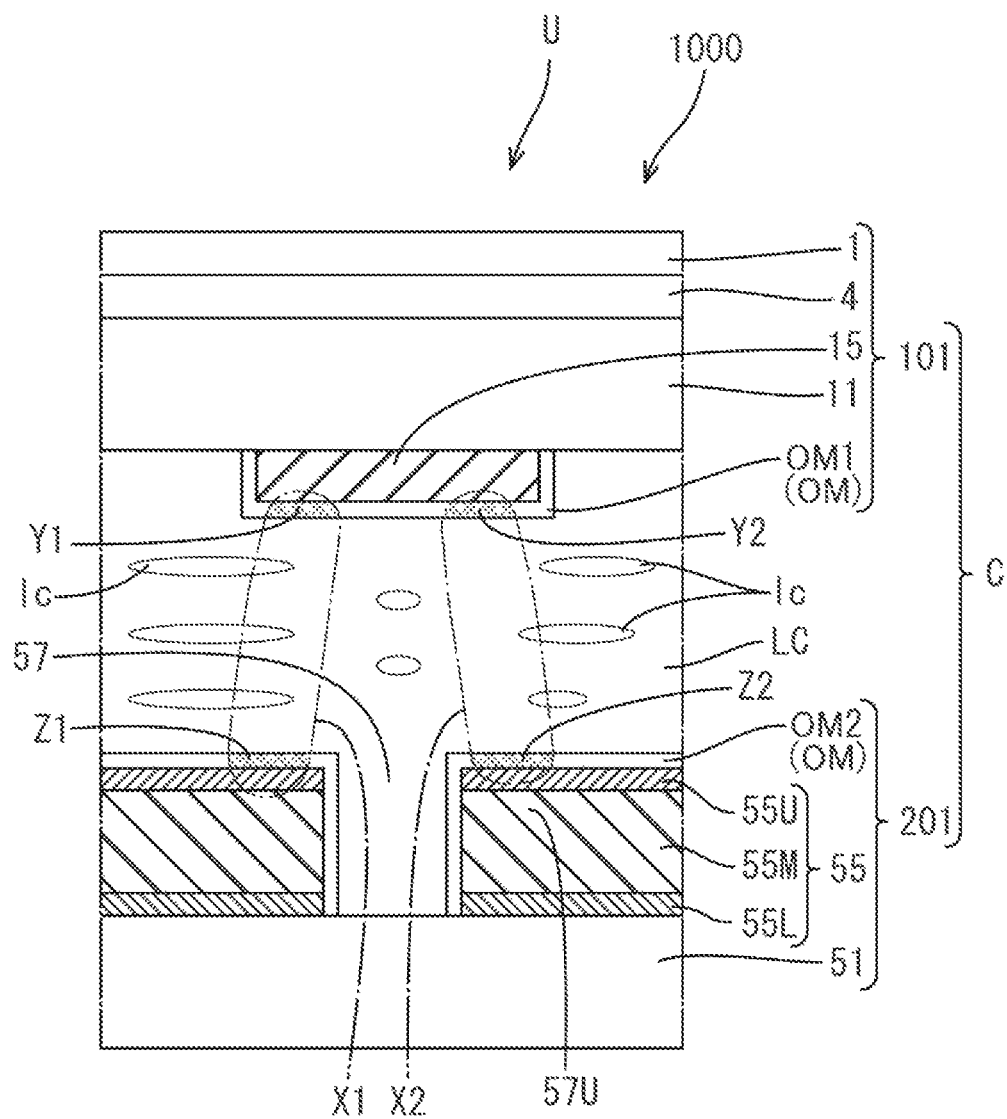
FIG. 9 is a cross-sectional view schematically showing a part of the TFT substrate, a part of a liquid crystal layer, and a part of the slot substrate that constitute an antenna unit of the scanning antenna according to the first embodiment.

The description returns to the first embodiment. FIG. 9 is a cross-sectional view schematically showing a part of the TFT substrate 101, a part of the liquid crystal layer LC, and a part of the slot substrate 201 that constitute an antenna unit U of the scanning antenna 1000 according to the first embodiment. In the antenna unit U, as shown in FIG. 9, the island-shaped patch electrode 15 of the TFT substrate 101 and the hole-shaped (groove-shaped) slot 57 (slot electrode unit 57U) of the slot substrate 55 are opposed to each other with the liquid crystal layer LC interposed therebetween. Such a scanning antenna 1000 includes a liquid crystal cell C having the liquid crystal layer LC and a pair of the TFT substrate 101 and the slot substrate 201 between which the liquid crystal layer LC is sandwiched. The antenna unit U is configured herein to include one patch electrode 15 and a slot electrode 55 (slot electrode unit 57U) in which at least one slot 57 corresponding to the patch electrode 15 is disposed.

A sealing material (not illustrated) surrounding the liquid crystal layer LC is disposed between the TFT substrate 101 and the slot substrate 201, which are a pair of substrates that constitute the liquid crystal cell C. The sealing material has a function of adhering to the TFT substrate 101 and the slot substrate 201 to bond the TFT substrate 101 and the slot substrate 201 to each other. The TFT substrate 101 and the slot substrate 201 constitute a pair of substrates opposed to each other with the liquid crystal layer LC sandwiched therebetween.

The sealing material is a material obtained by curing a sealing material composition containing a curable resin. The sealing material composition used is basically solventless. The curable resin used is a photo-curable and/or heat-curable resin that is cured by light (e.g. ultraviolet rays, visible light, or the like) and/or cured by heat. The type of sealing material is selected as appropriate according to how the liquid crystal material is injected. For example, in a case where the liquid crystal material is injected into the liquid crystal cell C by a drop injection method (ODF method), a photo-curable (e.g. visible light curable) and heat-curable resin is used as the curable resin, as such a resin makes it easy, for example, to exercise control with curing divided into two stages, namely temporary curing and final curing. Examples of such a curable resin include resin (commercially available as "UVAC1561" from Daicel-UCB Co. Ltd.) composed of a mixture of epoxy resin and acrylic resin and the like. Alternatively, in a case where the liquid crystal material is injected into the liquid crystal cell C by a vacuum injection method, a photo-curable resin or a heat-curable resin is used as the curable resin.

The alignment films CM (OM1 and OM2) exert their orientation-retaining force to cause liquid crystal molecules 1c constituting the liquid crystal layer LC to be aligned parallel to the TFT substrate 101 and the slot substrate 201 in the absence of the application of a voltage between the patch electrode 15 and the slot electrode 55 (i.e. in the absence of the application of a voltage) (see FIG. 9). The liquid crystal molecules 1c are aligned in random directions in planes of the TFT substrate 101 and the slot substrate 201 in the absence of the application of a voltage. That is, when the TFT substrate 101 and the slot substrate 201 are seen in a plan view in the absence of the application of a voltage, the liquid crystal molecules 1c are not aligned along one particular direction but oriented in various directions. On the other hand, in the presence of the application of a voltage between the patch electrode 15 and the slot electrode 55, the liquid crystal molecules 1c rise to be aligned so that their long axes become perpendicular to the TFT substrate 101 and the slot substrate 201.

Places between the patch electrode 15 and the slot electrode 55 where capacitors are formed are mainly parts (ranges X1 and X2 shown in FIG. 9) where the patch electrode 15 and the slot electrode 55 overlap each other with the liquid crystal layer LC sandwiched therebetween. That is, at least the alignment films OM need only be formed on such parts overlapping each other. Specifically, at least the alignment film OM1 needs only be formed on a part Y1 of the alignment film OM1 formed on the patch electrode 15 shown in FIG. 9 that overlaps the left-side slot electrode 55 and a part Y2 of the alignment film OM1 that overlap the right-side slot electrode 55. As for the alignment film OM2 formed on the slot substrate 55, at least the alignment film OM2 needs only be formed on parts Z1 and Z2 that overlap the parts Y1 and Y2, respectively. Therefore, no alignment films OM need to be formed on a central part (between the parts Y1 and Y2) of the patch electrode 15, a lateral part of the slot electrode 55 (that faces the slot 57), or the like.

Even when the alignment films OM (OM1 and OM2) are formed on the patch electrode 15 of the TFT substrate 101 and the slot electrode 55 of the slot substrate 201, respectively, as in the first embodiment, capacitors are substantially not formed (capacitance is not obtained); therefore, the tunability of capacitance by the tuning on and turning off of the liquid crystals translates directly into the tunability of the antenna element. Accordingly, in the first embodiment, the liquid crystal cell C achieves a great change in capacitance.

Method for Manufacturing Scanning Antenna

Manufacturing a scantling antenna includes executing a step of filling a space between a TFT substrate 101 and a slot substrate 201 with a liquid crystal layer LC. A liquid crystal material (liquid crystal compound) constituting the liquid crystal layer LC may be injected into the space between the TFT substrate 101 and the slot substrate 201 by a drop injecting method (ODF: One Drop Fill) or may be injected into the space between the TFT substrate 101 and the slot substrate 201 by a vacuum injection method as in a conventional process of manufacturing a liquid crystal display panel.

First, the TFT substrate 101 and the slot substrate 201 are prepared in advance, and a sealing material composition for use in ODF is drawn into the shape of a frame onto either of the substrates (in this example, the TFT substrate 101) by a seal dispenser. The sealing material composition contains, for example, a thermosetting epoxy resin and the like.

Next, the liquid crystal material is applied by the ODF method into the frame thus drawn, and after that, the substrate (TFT substrate 101) and the other substrate (slot substrate 201) are bonded together in such a manner that the sealing material composition and the liquid crystal material are sandwiched therebetween. After that, the sealing material composition is cured and the liquid crystal molecules are subjected to a realigning process by heating. In this way, a liquid crystal cell C can be fabricated.

After that, a reflective conducting plate 65 is assembled to the liquid crystal cell C so that the reflective conductive plate 65 is opposed to an opposite surface of the slot substrate 201 (second dielectric substrate 51) of the cell with a dielectric substance (air layer) 54 interposed therebetween. Through such a process, a scanning antenna according to the first embodiment is manufactured.

Although the first embodiment has illustrated a liquid crystal cell that is used in a scanning antenna, it may be a liquid crystal cell for use in another device (e.g. a liquid crystal cell for a liquid crystal lens that includes liquid crystals as an optical element and controls the focal length according to a voltage applied), provided the objectives of the technology described herein are not impaired.

EXAMPLES

The technology described herein is described in more detail below on the basis of examples. It should be noted that these examples are not intended to limit the technology described herein whatsoever.

Example 1

Fabrication of Liquid Crystal Cell for Use in Scanning Antenna

Figure 10:
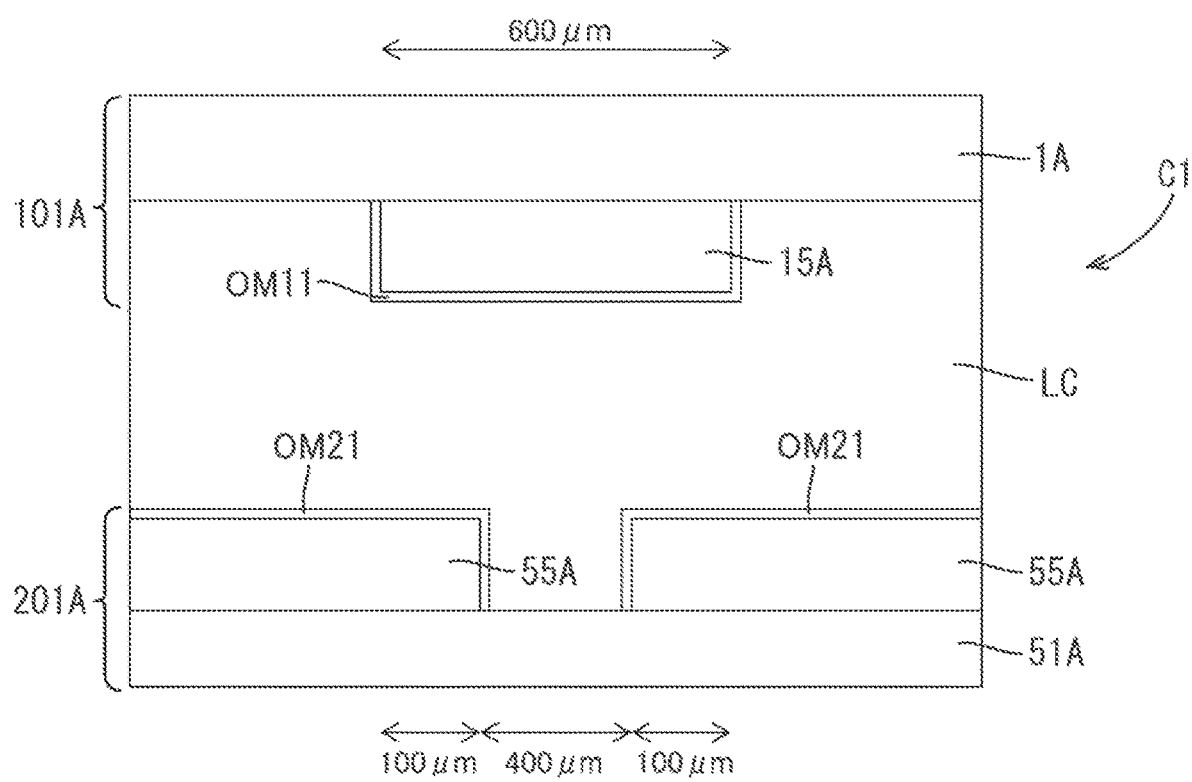
FIG. 10 is a cross-sectional view schematically showing a configuration of a liquid crystal cell of Example 1.

A liquid crystal cell C1 configured as shown in FIG. 10 was fabricated by a method described below. First, a TFT substrate 101A and a slot substrate 201A were prepared. The TFT substrate 101A was identical in basic configuration to the aforementioned TFT substrate 101 with an alignment film OM11 yet to be formed. Similarly, the slot substrate 201A was identical in basic configuration to the aforementioned slot substrate 201 with an alignment film OM21 yet to be formed. A patch electrode 15A of the TFT substrate 101A and a slot electrode 55A of the slot substrate 201A were each formed from Cu. Further, the thickness of the patch electrode 15A was set to be 1 μm, and the thickness of the slot electrode 55A was set to be 2 μm. Further, as shown in FIG. 10, the width of the patch electrode 15A was set to be 600 μm, the width between slot electrodes 55A was set to be 400 μm, and the length (overlap length) of a part where the slot electrode 55A and the patch electrode 15A overlap in a plan view was set to be 100 μm.

In FIG. 10, the TFT substrate 101A and the slot substrate 201A are each schematically represented for convenience of explanation in such a manner that the patch electrode 15A is disposed on a surface of a first dielectric substrate 1A and the slot substrate 55A is disposed on a surface of a second dielectric substrate 51A.

Ti films each with a thickness of 50 nm were formed on the patch electrode 15A of the TFT substrate 101A and the slot electrode 55A of the slot substrate 201, respectively, by an evaporation method. After that, the oxidation of the surfaces of the Ti films was promoted by heating the TFT substrate 101 and the slot substrate 201 at 250° C. for one hour. Furthermore, the surfaces of the Ti films were subjected to a hydrophilization process by irradiating these substrates with black light (containing ultraviolet rays) under a condition of 2 J/cm$^2$, whereby the alignment films OM11 and OM12 were formed on the electrodes 15A and 55A of the TFT substrate 101A and the slot substrate 201A, respectively.

A thermosetting sealing material (commercially available as "HC-1413FP" from Mitsui Chemicals, Inc.) was drawn into the shape of a frame on a surface of the TFT substrate 101A (that faces the liquid crystal layer LC) by a seal dispenser, and then a liquid crystal material ($\Delta\varepsilon$=20, 1 kHz, 20° C.) was applied by an ODF method into the frame thus drawn. After that, the slot substrate 201A was bonded to the TFT substrate 101A with the thermosetting sealing material interposed therebetween. After that, the thermosetting sealing material was cured and the liquid crystal molecules v/ere subjected to a realigning process by heating at 130° C. for 40 minutes, whereby a liquid crystal cell C1 for use in a scanning antenna of Example 1 was obtained in which the liquid crystals were horizontally aligned.

Comparative Example 1

As an alignment film solution for forming an alignment film, an alignment film solution composed mainly of polyimide was prepared. As a solvent of the alignment film solution of Comparative Example 1, a mixed solvent obtained by mixing NMP and BCS (butyl cellosolve) in the ratio of 1 to 1 (volume ratio) was used. Further, the alignment film solution of Comparative Example 1 had a solid content concentration of 5% by mass. A TFT substrate and a slot substrate which were similar to those of Example 1 were prepared, and the alignment film solution was applied onto a patch electrode of the TFT substrate and a slot electrode of the slot substrate. Coatings on the substrates were heated at 70° C. for five minutes and then further heated at 200° C. for 30 minutes. Then, the coatings thus heated were subjected to an alignment process by a rubbing process. In this way, alignment films each composed mainly of polyimide were formed on the respective electrodes of the TFT substrate and the slot substrate. From this point forward, a liquid crystal cell of Comparative Example 1 was fabricated in a manner similar to Example 1.

<Capacitance Modulability Evaluation>

A CV waveform was measured using Precision LCR Merter: 4248A manufactured by Hewlett-Packard Co. The voltage applied had 30 Hz, 15V, and a rectangular wave. The on/off modulability $\alpha$ of capacitance was calculated as $\alpha=(Con-Coff)/Coff$, where Coff is capacitance at a voltage of 0 V and Con is capacitance at a voltage of 15 V. It should be noted that the modulability $\alpha$ is also expressed as $\Delta C/Coff$ or $Con/(Coff-1)$.

The capacitance modulability of an antenna unit (antenna element) was measured using a liquid crystal cell C1 of Example 1. The result was $\alpha=1.4$. On the other hand, the capacitance modulability of an antenna unit was measured using the liquid crystal cell of Comparative Example 1, with the result that $\alpha=0.94$. It was confirmed that greater modulability $\alpha$ of an antenna unit can be attained by, as in Example 1, using alignment films OM11 and OM 22 each composed of a titanium film and a thin titanium oxide film formed on a surface of the titanium film.

In a scanning antenna (liquid crystal antenna) including the liquid crystal cell C1, the phase of a radio wave (oscillation of electrons) induced in the patch electrode 15A is controlled by changing a liquid crystal capacitor capacitance C1c through control of the orientation of liquid crystals by voltage application driving (i.e. through switching between horizontal orientation and vertical orientation of the liquid crystal molecules). Moreover, the azimuth of an antenna beam is controlled by the ON/OFF pattern (interference pattern). Therefore, with a higher ON/OFF ratio in capacitance of liquid crystals, an antenna with higher directivity and higher efficiency can be fabricated.

In a case where a conventional alignment film (polyimide film) composed of an insulating material is used as in the case of Comparative Example 1, the capacitance of an antenna unit is capacitance obtained by combining the capacitance of liquid crystals and the capacitance of an alignment film layer, as a layer composed of the alignment film serves as a capacitor. Therefore, a change in resultant capacitance in the case of an antenna unit is small.

On the other hand, the alignment films OM11 and OM21 of Example 1 each have a two-layer structure including a metal film (titanium film) that occupies a large part thereof and a metal oxide film (titanium oxide film), formed on a surface thereof, that is in contact with liquid crystals. The metal oxide films (titanium oxide films) at the respective surfaces of the alignment films OM11 and OM21 are insulators in a narrow sense; however, since they have extremely small thicknesses and high relative dielectric constants, the capacitance of those parts is substantially zero. Thus, since the alignment films OM11 and OM21 of Example 1 are mostly metals (conductors) and substantially do not serve as capacitors (i.e. do not have capacitance), the tunability of capacitance by the tuning on and turning off of the liquid crystals translates directly into the tunability of the antenna element. As a result, Example 1 attains a great change in capacitance. Thus, Example 1 gave a liquid crystal cell C1 for use in a high-directivity and high-efficiency scanning antenna (liquid crystal antenna).

Example 2

A liquid crystal cell of Example 2 was fabricated in the same manner as Example 1, except that alignment films each composed of a zinc (Zn) film and a zinc oxide (ZnO) film were formed instead of the alignment films each composed of a titanium (Ti) film and a titanium oxide ($TiO_2$) film. Zn films each with a thickness of 50 nm were formed by evaporation on the patch electrode of the TFT substrate and the slot electrode of the slot substrate, respectively.

The capacitance modulability $\alpha$ of an antenna unit was measured regarding a liquid crystal cell of Example 2 in a manner similar to Example 1. The result was $\alpha=1.5$. In this way, it was confirmed that the modulability $\alpha$ of an antenna unit can be increased even when zinc-based alignment films are used instead of the titanium-based alignment films used in Example 1.

Example 3

Figure 11:
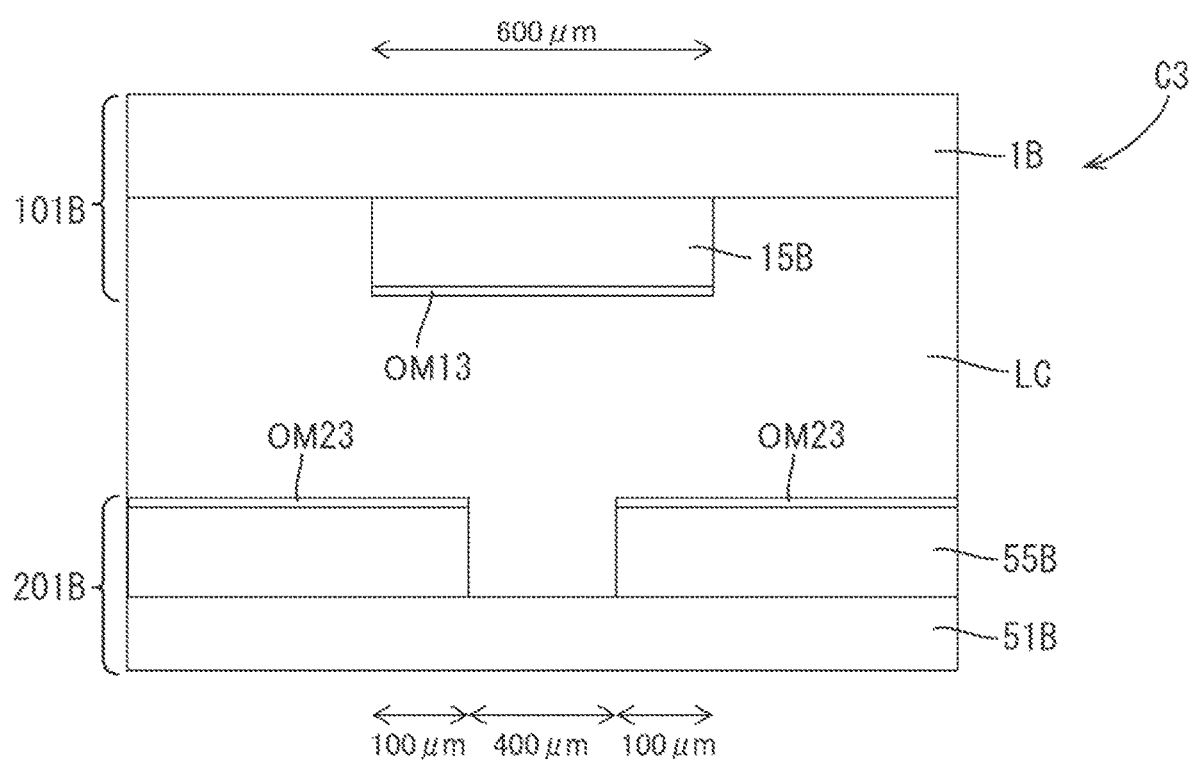
FIG. 11 is a cross-sectional view schematically showing a configuration of a liquid crystal cell of Example 3.

FIG. 11 is a cross-sectional view schematically showing a configuration of a liquid crystal cell C3 of Example 3. The liquid crystal cell C3 includes a TFT substrate 101B having a patch electrode 15B disposed on a surface of a first dielectric substrate 1B and a slot substrate 201B having a slot electrode 55B disposed on a surface of a second dielectric substrate 51B. In Example 3, a TFT substrate 101B and a slot substrate 201B that are identical in configuration to those of Example 1 were prepared, except that a patch electrode 15B was made of aluminum with a thickness of 3 μm and a slot electrode 55B was made of aluminum with a thickness of 5 μm. By heating TFT substrate 101B and the slot electrode 55B at 250° C. for one hour, the oxidation of the respective surfaces of the patch electrode 15B and the slot electrode 55B was promoted. Furthermore, the respective surfaces of the patch electrode 15B and the slot electrode 55B were subjected to a hydrophilization process by irradiating these substrates with black light (containing ultraviolet rays) under a condition of 2 $J/cm^2$, whereby alignment films OM13 and OM23 each constituted by a thin film (metal oxide film) of a metal oxide (aluminum oxide) were formed on the electrodes 15B and 55B, respectively. From this point forward, a liquid crystal cell C3 of Example 3 was fabricated in a manner similar to Example 1.

The capacitance modulability α of an antenna unit was measured regarding a liquid crystal cell of Example 3 in a manner similar to Example 1. The result was α=1.4. By thus forming the alignment films OM13 and 23 directly on the patch electrode 15B and the slot electrode 55B, respectively, the process of forming a metal film can be simplified.

The invention claimed is:

1. A liquid crystal cell in which a plurality of antenna units are arrayed, the liquid crystal cell comprising:
   a TFT substrate including a first dielectric substrate, a plurality of TFTs supported by the first dielectric substrate, and a plurality of patch electrodes electrically connected to the TFTs;
   a slot substrate including a second dielectric substrate and a slot electrode including a plurality of slots supported by the second dielectric substrate;
   an alignment film provided on a surface of at least either each of the patch electrodes or the slot electrode, the alignment film including a metal oxide film at a foremost surface of the alignment film, the metal oxide film developing an orientation-retaining force to align liquid crystal molecules; and
   a liquid crystal layer sandwiched between the TFT substrate and the slot substrate and containing liquid crystal molecules aligned parallel to the TFT substrate and the slot substrate in a state in which no voltage is applied between the patch electrode and the slot electrode opposed to each other.

2. The liquid crystal cell according to claim 1, wherein the metal oxide film contains an oxide of one type of metal or alloy selected from the group consisting of Ti, Zn, Ni, Al, Cu, W, Ru, Ag, Cr, and alloys thereof.

3. The liquid crystal cell according to claim 1, wherein the metal oxide film has a thickness in a range from 0.1 nm to 10 nm.

4. The liquid crystal cell according to claim 1, wherein the alignment film includes a metal film provided on the surface of at least either the patch electrode or the slot electrode and the metal oxide film formed on a surface of the metal film.

5. The liquid crystal cell according to claim 4, wherein the metal film contains one type of metal or alloy selected from the group consisting of Ti, Zn, Ni, Al, Cu, W, Ru, Ag, Cr, and alloys thereof.

6. The liquid crystal cell according to claim 4, wherein the metal film has a thickness of 10 nm or larger.

7. The liquid crystal cell according to claim 4, wherein the metal oxide film contains an oxide of a metal constituting the metal film.

8. The liquid crystal cell according to claim 1, wherein the metal oxide film is made of an oxide of a metal constituting the patch electrode and/or the slot electrode.

9. The liquid crystal cell according to claim 1, wherein the metal oxide film has a surface energy of 40 mJ/m$^2$ or higher.

10. The liquid crystal cell according to claim 1, wherein the liquid crystal molecules are aligned in random directions in planes of the TFT substrate and the slot substrate.

11. The liquid crystal cell according to claim 1, wherein each of the liquid crystal molecules has at least one functional group selected from the group consisting of a halogen group, an SCN group, an NCS group, a CN group, an OCN group, an NCO group, a CF$_3$ group, an OCF$_3$ group, and an SF$_5$ group.

12. The liquid crystal cell according to claim 1, wherein each of the liquid crystal molecules has at least one bond selected from the group consisting of a carbon-carbon triple bond, —CH=CH—, —CF=CF—, —CF=CH—, —CH=CF—, —(CO)O—, —O(CO)—, —CO—, and —O—.

13. A scanning antenna comprising:
   a liquid crystal cell according to claim 1; and
   a reflective conducting plate disposed to be opposed to an outer principal surface of the second dielectric substrate of the liquid crystal cell with a dielectric layer interposed therebetween.

* * * * *